June 27, 1961 P. R. JOHANNESSEN 2,990,516

PULSE-WIDTH MODULATED AMPLIFIER AND METHOD

Filed May 29, 1956 2 Sheets-Sheet 1

INVENTOR
PAUL R. JOHANNESSEN

BY Rines and Rines

ATTORNEYS

INVENTOR
PAUL R. JOHANNESSEN

BY Rines and Rines
ATTORNEYS

2,990,516
PULSE-WIDTH MODULATED AMPLIFIER AND METHOD

Paul R. Johannessen, 87—3 Lyman St., Waltham 54, Mass., assignor of one-half to John C. Simons, Jr., Belmont, Mass.

Filed May 29, 1956, Ser. No. 588,063
9 Claims. (Cl. 330—10)

The present invention relates to pulse-width modulated amplifiers and methods, and, more particularly, to transistor amplifier circuits.

One of the problems attendant upon the use of transistor amplifier circuits is to provide power amplification of an input signal. Proposals have heretofore been made to combine magnetic amplifiers and transistor amplifier stages to accomplish this end, but they have been relatively inefficient. While the invention will hereinafter be described as applied to magnetic and transistor amplifiers for which it is particularly adapted, moreover, it is to be understood that it may also be practiced, from its broadest aspect, with the aid of electron-tube and other well-known amplifiers.

An object of the present invention, accordingly, is to provide a new and improved amplifier and method that, from a broad aspect, relate to converting an input signal into a train of pulses time or width-modulated in accordancewith a function related to the amplitude of the signal, then amplifying the same with class B-type amplifying operation, and recovering an amplified signal corresponding to the original input signal.

A further object is to provide a novel magnetic-amplifier and transistor-amplifier system.

Still an additional object is to provide a new and improved substantially class B-type transistor amplifier system.

Other and further objects will be explained hereinafter and will be more particularly pointed out in the appended claims.

The invention will now be explained in connection with the accompanying drawings, FIG. 1 of which is a block diagram illustrating the principle of operation of the invention;

Figure 1:
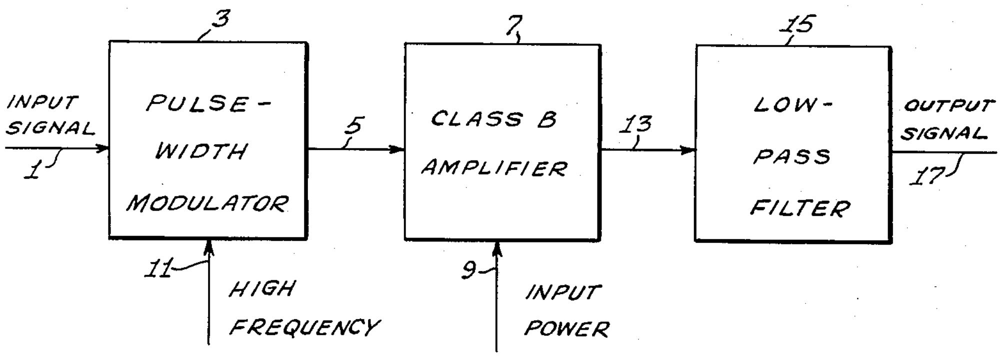

Referring to FIG. 1, alternating-current amplification is shown effected by feeding an input signal by conductor 1 to a time or pulse-width modulator 3 that, in accordance with the present invention, is controlled by an alternating-current carrier frequency, such as a train of pulses, applied at 11 and preferably, as later explained, of frequency high compared with the frequency or frequencies involved in the input signal; or, in the case of direct-current input signals, greater than any signal rate or rates present in the input signal. The input signal may be an error-signal modulated 400-cycle-per-second carrier, for example, in servo amplifier systems. There will therefore result in the output 5 a train of pulses the width of the successive pulses of which varies in accordance with a function related to the instantaneous amplitude of the input signal received at 1. The pulse-width variation may, for example, be proportional to the amplitude of the input signal. The train of pulses is then fed to an amplifier 7 which is supplied at 9 from a direct-current source of power and is adapted to operate as a switching device, such as a substantially class B (or class A–B, etc.) amplifier, in order to modulate the power source in accordance with the train of pulses, thus to poweramplify the same. By utilizing a low-pass filter 15 or the like in the output circuit 13, the high-frequency components introduced by the high-frequency pulses constituting the amplified train of pulses may be eliminated, recovering at 17 an amplified amplitude signal variation corresponding to the waveform of the original input signal. The generalized block diagram of FIG. 1 illustrates that, from its more broad considerations, the techniques underlying the present invention are capable of being practiced with the aid of a wide variety of different types of vitally different apparatus including, for example, transistor, electron-tube and even mechanical-switching modulating amplifier members 7 and, of course, any of a wide variety of time or pulse-width modulators 3.

For purposes of providing improved circuit reliability, high efficiency, zero drift, high gain stability with environmental changes such as temperature and humidity, or for purposes of reducing physical size and weight, it is preferable to employ a magnetic-amplifier pulse-width modulator 3 and a transistor Class B power amplifier 7. Such an amplifier system can be used with great advantage for such purposes as a 60 to 400 cycle-per-second servo amplifier, an operational amplifier in an analog computer, or an audio amplifier, to mention but a few applications.

Figure 2:
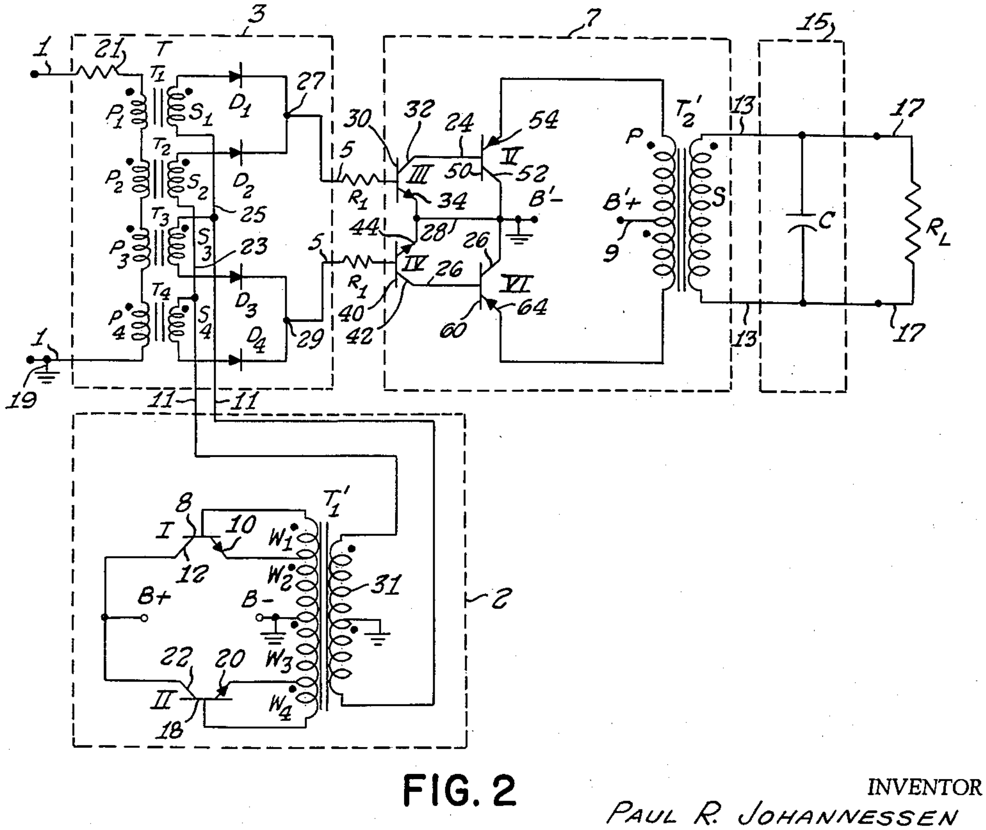
FIG. 2 is a schematic circuit diagram of a preferred embodiment of the invention.

A preferred circuit of this type is illustrated in FIG. 2 embodying a magnetic amplifier pulse-width modulating system 3 of the full-wave, high-gain, high-frequency type. The input signal is received along upper and lower input conductors 1, the latter of which may be grounded at 19, and is applied through a series impedance, illustrated as a resistor 21, between the upper and lower terminals of the series-connected primary winding sections $P_1$, $P_2$, $P_3$, $P_4$, of four saturable-core transformers $T_1$, $T_2$, $T_3$, $T_4$. Cooperating with the four winding sections $P_1$, $P_2$, $P_3$, $P_4$, are four corresponding secondary inductance winding sections $S_1$, $S_2$, $S_3$, $S_4$. The upper terminal of the winding section $S_1$ is connected through a rectifier, such as a diode $D_1$, in series with a reversely poled diode $D_2$ and the upper terminal of the winding section $S_2$. The lower terminal of the winding section $S_2$ is, in turn, connected by conductor 23 to the upper terminal of the winding section $S_4$ and thence through the diode $D_4$, in series with the reversely poled diode $D_3$ and the lower terminal of the winding section $S_3$. The upper terminal of the winding section $S_3$ is connected by conductor 25 to the lower terminal of the first-mentioned secondary winding section $S_1$. The conductors 23 and 25 are connected to the conductors 11 supplying anti-phase high-frequency carrier energy from a grounded center-tapped output winding 31 of a high-frequency transistor oscillator or converter 2. The points 27 and 29 of series connection of the respective pairs of diodes $D_1$, $D_2$ and $D_3$, $D_4$ are connected to the output conductors 5. The magnetic amplifier 3 is, accordingly, operated in push-pull.

Figure 3:
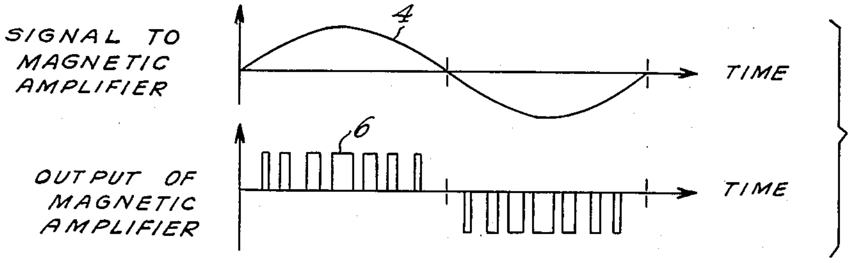
FIG. 3 is a graph representing waveforms involved in the circuit of FIG. 2.

It is believed conducive to explanation to describe the operation of each section of the magnetic amplifier 3 separately, such as the section $S_1$, $D_1$. The output of this section is uni-directional and half-wave, but by combining four such sections together as above described, a full-wave phase-reversible output is obtained. During the negative half-cycles of the before-mentioned preferably high-frequency alternating-current voltage, such as the pulses of the transistor oscillator or converter 2, the flux level of the saturable reactor winding $S_1$ is controlled with a small amount of power in view of the fact that the diode $D_1$ is blocked by the oscillator pulses and thus provides a high input impedance. During the positive half-cycles, on the other hand, the diode $D_1$ conducts. Because the ultimate load impedance, presented by resistors $R_1$ connected to the amplifier 7, is small compared to the impedance of the saturable reactor $S_1$ when it is unsaturated, substantially all the voltage of the high-frequency pulses from the oscillator 2 appears across the reactor $S_1$. When the reactor $S_1$ saturates, its impedance suddenly becomes small relative to the said load impedance, and most of the voltage of the pulses from the oscillator 2 then appears across the load $R_1$. The instant during the positive half-cycle at which saturation occurs, is determined by the flux-level of the saturable reactor $S_1$ at the beginning of the positive half-cycle. The flux-level at the beginning of the positive half-cycle, in turn, is determined by the input signal voltage at 1 during the preceding negative half-cycle of the voltage from the oscillator 2. The extent to which the reactor flux level is "reset" is actually proportional to the average input voltage during the negative half-cycle immediately preceding. If the input signal received by conductors 1 is a sinusoidal carrier wave 4, FIG. 3, the extent of this "reset" is also proportional to the peak amplitude of the input signal. The area of a resulting output voltage pulse 6 must be proportional to the flux reset and, therefore, is proportional to the input signal amplitude. The peak amplitude of the pulse 6 is fixed by the amplitude of the pulses fed from the oscillator 2. By this mechanism, therefore, the output voltage at the conductors 5 will consist of a sequence or train of rectangular pulses 6 the width of the successive pulses of which is proportional to the input voltage, and thus the desired time or pulse-width modulation is obtained.

The transistor oscillator or converter 2 may produce alternating-current energy, such as the high-frequency pulses before mentioned, at a frequency greater than that of the input signal; say, for example, ten times the highest input signal frequency, more or less. The oscillator 2 comprises a pair of transistor amplifiers I and II of, for example, the N-P-N type having respective bases 8 and 18, emitters 10 and 20, and collectors 12 and 22. The collectors 12 and 22 are connected to the positive terminal of a source of direct-current voltage B+. The bases 8 and 18 are connected together through a four-segment primary winding $W_1$, $W_2$, $W_3$, $W_4$ cooperative with a saturable core $T_1'$ and the secondary or output winding 31, before discussed. The emitter 10 is connected to the lower terminal of the winding $W_1$ and the emitter 20 is connected to the upper terminal of the winding $W_4$. The point of connection of the windings $W_2$ and $W_3$ is connected to the negative voltage source terminal B−, which may be grounded, as shown. In operation, consider, for example, that the emitter 10 is negative with respect to the base 8 and the transistor I is accordingly conductive while the transistor II is non-conductive. Current will flow in successively increasing amounts through the winding $W_1$ between the emitter 10 and the base 8. When the core $T_1'$ saturates, this current will start to decrease. Such a current decrease will decrease the current flowing between the emitter 10 and the collector 12 which, in turn, will decrease the emitter-to-base current, and so on. This unstable process takes place very rapidly, resulting in the reversal of the voltage across the winding $W_1$ and rendering the transistor I non-conductive or effectively open-circuited, and causing the oppositely phased transistor II to conduct. The same cycle then takes place in the transistor II so that the transistors I and II will alternately switch on and off producing substantially square or rectangular-wave oscillations. Suitable core material $T_1'$ for effecting such operation through providing a substantially square or rectangular hysteresis loop, includes "Orthonal" or "Deltamax" materials and the like. The frequency of the oscillations of the oscillator 2 is determined by the number of turns on the windings $W_1$–$W_4$, the cross-sectional area of the core $T_1'$ and the magnitude of B+, any of which factors may be varied to vary the frequency.

It now remains to explain the operation of the class B or substantially class B system 7. The anti-phase conductors 5 are shown connected through the load resistors $R_1$ to the bases 30 and 40 of transistor amplifiers III and IV. The transistor III and a further transistor V comprise a first pair of series-connected transistor amplifiers that is connected in push-pull with a second pair of series-connected transistor amplifiers IV and VI. The amplifiers III and IV may be of the type N-P-N, such as 1N35 transistors, and the amplifiers V and VI may be of the type P-N-P, such as 1N68 transistors. The collector 32 of the transistor III is connected to the base 50 of the transistor V by conductor 24. The collector 42 of the transistor IV is similarly connected to the base 60 of the transistor VI by the conductor 26. The emitters 34 and 44 of the transistors III and IV are connected together and to the B'− or ground terminal conductor 28. The emitters 54 and 64 of the transistors V and VI, however, are connected together through the primary winding P of a transformer $T_2'$, the center tap of which is connected by the conductor 9 to the B'+ terminal of a source of preferably direct-current voltage that serves as the power or amplifying source of energy. The power source B'+, B'−, indeed, may be alternating-current, including pulse waveforms. In all cases, the power source is modulated by the transistor amplifier-modulator 7. The collectors 52 and 62 of the transistors V and VI are connected to the grounded conductor 28.

It will suffice to explain the operation of the pair of transistor amplifiers III and V, since similar but anti-phase operational conditions will obtain at the other pair of amplifiers IV, VI. When current $i$ flows into the base 30 of the amplifier III of gain $\beta_1$, current can flow between the collector 32 and emitter 34, without developing a voltage drop therebetween, up to a value of $\beta_1 i$. The transistor III at such time behaves substantially as a short-circuit for current to flow between conductors 24 and 28. Similarly, current can flow between the emitter 54 and the collector 52 of the transistor V of gain $\beta_2$ without developing a voltage drop thereacross so long as the current does not exceed $\beta_1\beta_2 i$. Under such conditions, accordingly, the transistor V provides a short-circuit path that enables the power source B'+, B'− to send current through the upper winding P of the transformer $T_2'$ and between the emitter 54 and collector 52 of the transistor V. That current may have a maximum value of the considerably amplified current $\beta_1\beta_2 i$.

When however, zero current flows into the base 30 of the transistor III, the transistor behaves as an open-circuit between the collector 32 and the emitter 34 preventing current flow in the loop comprising conductors 24 and 28 and thus preventing collector-to-emitter current in the transistor V. Class B or substantially Class B-type operation is thus achieved, the transistors alternately conducting and non-conducting in accordance with the train of pulse-width-modulated pulses 6, correspondingly modulating the power source B'+, B'−.

An amplified output signal may be recovered or obtained from the secondary winding S, corresponding to the amplitude-varying wave form of the original input signal at 1, by the low-pass filtering action of a capacitor C. Such an amplified signal is then fed to an ultimate load $R_L$. The amplification, moreover, has been effected with high efficiency in view of the operation of the transistors III, IV, V, VI as switching devices to modulate the power source B'+, B'−. The standby power input, indeed, should be less than ten percent of maximum power output.

Figure 4:
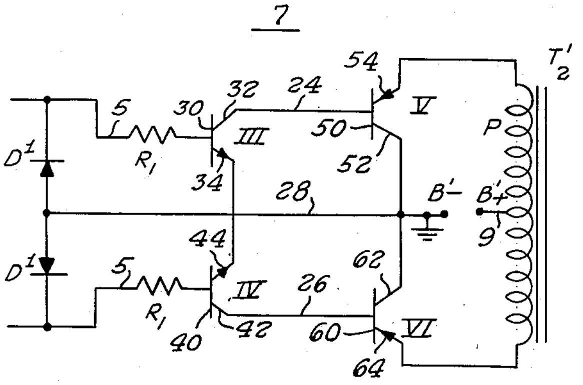
FIGS. 4 and 5 are fragmentary schematic circuit diagrams of modifications.

In the event that appreciable magnetizing current in magnetic amplifier system 3 might flow to the bases 30, 40 of the transistors III, IV during the condition of no input signal, supplemental low-impedance diodes D', FIG. 4, may be connected between the conductors 5 and the ground-terminal conductor 28 to provide a low-impedance path to short-circuit or by-pass such magnetizing current from the bases 30, 40 in view of the constant leakage or reverse-current characteristic of the diodes, which may be of the germanium type.

Figure 5:
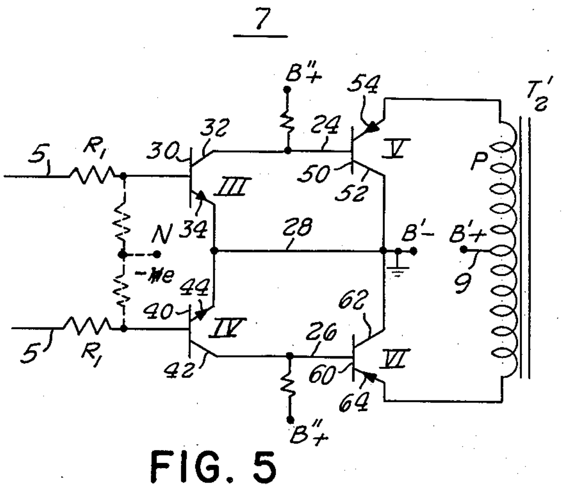

Alternatively, if some loss of gain can be tolerated, a bias potential B″+ (say 40 volts, more or less) of value greater than that of the power source B′+ (say 30 volts, more or less), FIG. 5, may be applied to the bases 50 and 60 of the transistors V and VI in order to keep the transistors V and VI cut off even though some current might flow through the transistors III and IV. Similarly, a negative potential N, shown dotted, could be applied between the bases 30 and 40 and ground to maintain the transistors III and IV cut off.

As a further modification, clippers may be employed in the output of the pulse-width modulator 3 to render the train of pulses 6 of substantially constant amplitude in the event that the modulator 3 itself does not accomplish this result.

Further modifications will occur to those skilled in the art and all such are considered to fall within the spirit and scope of the invention as defined in the appended claims.

What is claimed is:

1. An electric system having in combination at the same location, means for receiving an input signal to be amplified, pulse-width-modulator means connected to the receiving means for producing a train of pulses the pulse width of the successive pulses of which varies in accordance with a function related to the amplitude of the received input signal, substantially class B amplifier means having its input connected by passive coupling means to the output of said modulator means, said amplifier means including a source of power and electric-discharge-device switch means controlled by said train of pulses to interrupt the power from said source in accordance with the train of pulses and thereby to produce an output train of pulses of much greater power level than but of substantially the same wave form as the pulses of the first-mentioned train, and low pass filter means connected by a passive coupling means to the output of said amplifier means for producing from the amplified pulses an output signal which is an amplified accurate reproduction of said input signal.

2. The system of claim 1, said modulator means comprising a magnetic amplifier having a source of alternating-current energy coupled thereto for determining the pulse repetition frequency at the output of said modulator.

3. The system of claim 1, in which the said electric-discharge-device switch means comprises transistor means.

4. The system of claim 1, said amplifier means comprising at least one transistor biased to operate with substantially class B operation.

5. The system of claim 1, said amplifier means comprising first and second pairs of series-connected transistor amplifiers connected in push-pull.

6. The system of claim 5 in which the transistors of the first and second pairs are respectively of the types N-P-N and P-N-P.

7. The system of claim 1, said modulator means comprising a magnetic amplifier having push-pull connected saturable inductances and rectifiers.

8. The system of claim 1, said input signal being a signal-modulated carrier wave of predetermined frequency, said modulator means comprising a magnetic amplifier having coupled thereto a transistor oscillator source of voltage pulses of frequency greater than the predetermined frequency for determining the pulse repetition frequency of the output of said modulating means, and said amplifier means comprising at least one transistor biased to operate with substantially class B operation.

9. The system of claim 1 and in which the pulse-width-modulator means comprises a source of alternating-current energy of frequency higher than that of any frequency that may be contained in the said input signal.

References Cited in the file of this patent

UNITED STATES PATENTS

| | | |
|---|---|---|
| 2,266,401 | Reeves | Dec. 16, 1941 |
| 2,455,332 | Hare | Nov. 30, 1948 |
| 2,564,687 | Guenther | Aug. 21, 1951 |
| 2,567,896 | Semm | Sept. 11, 1951 |
| 2,703,877 | Stuff et al. | Mar. 8, 1955 |
| 2,714,705 | Volz | Aug. 2, 1955 |
| 2,740,086 | Evans et al. | Mar. 27, 1956 |
| 2,760,088 | Pittman et al. | Aug. 21, 1956 |
| 2,761,917 | Aronson | Sept. 4, 1956 |
| 2,773,132 | Bright | Dec. 4, 1956 |
| 2,780,782 | Bright | Feb. 5, 1957 |
| 2,785,236 | Bright et al. | Mar. 12, 1957 |
| 2,802,071 | Hung C. Lin | Aug. 6, 1957 |
| 2,817,061 | Bowers | Dec. 17, 1957 |
| 2,843,743 | Hamilton | July 15, 1958 |

FOREIGN PATENTS

| | | |
|---|---|---|
| 970,193 | France | June 7, 1950 |
| 167,451 | Australia | Apr. 12, 1956 |